(12) United States Patent
Brochhaus

(10) Patent No.: US 10,189,354 B2
(45) Date of Patent: Jan. 29, 2019

(54) BATTERY SYSTEM, AND METHOD FOR OPERATING SAID BATTERY SYSTEM

(71) Applicant: Robert Bosch GmbH, Stuttgart (DE)

(72) Inventor: Christoph Brochhaus, Aachen (DE)

(73) Assignee: Robert Bosch GmbH, Stuttgart (DE)

( * ) Notice: Subject to any disclaimer, the term of this patent is extended or adjusted under 35 U.S.C. 154(b) by 58 days.

(21) Appl. No.: 15/329,341

(22) PCT Filed: Jul. 14, 2015

(86) PCT No.: PCT/EP2015/066011
§ 371 (c)(1),
(2) Date: Jan. 26, 2017

(87) PCT Pub. No.: WO2016/015989
PCT Pub. Date: Feb. 4, 2016

(65) Prior Publication Data
US 2017/0210229 A1    Jul. 27, 2017

(30) Foreign Application Priority Data

Jul. 30, 2014   (DE) .................. 10 2014 214 996

(51) Int. Cl.
*B60L 3/00*        (2006.01)
*B60L 3/12*        (2006.01)
(Continued)

(52) U.S. Cl.
CPC .......... *B60L 3/0046* (2013.01); *B60L 3/0069* (2013.01); *B60L 3/0092* (2013.01); *B60L 3/12* (2013.01);
(Continued)

(58) Field of Classification Search
CPC ...... B60L 3/0069; B60L 3/12; B60L 11/1851; G01R 31/007; G01R 31/025;
(Continued)

(56) References Cited

U.S. PATENT DOCUMENTS

| | | | |
|---|---|---|---|
| 8,896,315 B1 * | 11/2014 | Davies .................. | H02J 7/0019 320/117 |
| 2008/0185994 A1 * | 8/2008 | Altemose .............. | H02J 7/0016 320/118 |

(Continued)

FOREIGN PATENT DOCUMENTS

| | | |
|---|---|---|
| DE | 102010047960 | 6/2011 |
| DE | 102011079126 | 1/2013 |

(Continued)

OTHER PUBLICATIONS

International Search Report for Application No. PCT/EP2015/066011 dated Sep. 24, 2015 (English Translation, 3 pages).

(Continued)

*Primary Examiner* — Calvin Cheung
(74) *Attorney, Agent, or Firm* — Michael Best & Friedrich LLP

(57) ABSTRACT

The invention relates to a method for operating a battery system (1) comprising a plurality of battery cells (8) and a battery management system for monitoring and controlling the battery cells (8), wherein the battery management system has a main controller (2) and a first measurement chain (34) and a second measurement chain (36) with in each case a plurality of measurement chips (40, 42) which are designed to redundantly detect measurement data from the battery cells (8) and in each case to carry out diagnoses and state of charge compensation of the battery cells (8). In this case, it is provided that the battery system (1) has a control channel by means of which a hierarchy state of the two measurement chains (34, 36) is defined, wherein, in the event of the breakdown of one of the measurement chains (34, 36), the battery system (1) is changed over to a mode with reduced availability and the hierarchy state is adjusted to the effect that the other measurement chain carries out the detection of the measurement data, the diagnoses and the state of charge (Continued)

compensation. A computer program and a battery management system which are designed to carry out the method and also a battery system (1) and a motor vehicle, the drive system of which is connected to a battery (16), are also specified.

9 Claims, 4 Drawing Sheets

(51) Int. Cl.
*B60L 11/18* (2006.01)
*G01R 31/36* (2006.01)
*H02J 7/00* (2006.01)
*H01M 10/42* (2006.01)
*H01M 10/48* (2006.01)
*G01R 31/00* (2006.01)
*G01R 31/02* (2006.01)
*G01R 31/44* (2006.01)

(52) U.S. Cl.
CPC ....... *B60L 11/1851* (2013.01); *B60L 11/1861* (2013.01); *B60L 11/1866* (2013.01); *G01R 31/007* (2013.01); *G01R 31/025* (2013.01); *G01R 31/36* (2013.01); *G01R 31/3658* (2013.01); *G01R 31/44* (2013.01); *H01M 10/425* (2013.01); *H01M 10/482* (2013.01); *H01M 10/486* (2013.01); *H02J 7/0016* (2013.01); *H02J 7/0021* (2013.01); *B60L 2240/545* (2013.01); *B60L 2240/547* (2013.01); *B60L 2240/549* (2013.01); *B60L 2250/16* (2013.01); *H01M 2010/4271* (2013.01); *H01M 2220/20* (2013.01); *Y02T 10/7005* (2013.01); *Y02T 10/7044* (2013.01); *Y02T 10/7055* (2013.01); *Y02T 10/7061* (2013.01)

(58) Field of Classification Search
CPC ............ G01R 31/3658; H01M 10/482; H01M 10/486; H01M 2010/4271; H01M 2220/20
See application file for complete search history.

(56) References Cited

U.S. PATENT DOCUMENTS

| | | | |
|---|---|---|---|
| 2009/0198399 A1* | 8/2009 | Kubo | B60L 11/1855 701/22 |
| 2009/0206841 A1* | 8/2009 | Weng | G01R 31/3658 324/426 |
| 2010/0225325 A1* | 9/2010 | Christensen | G01R 31/3624 324/426 |
| 2010/0295492 A1 | 11/2010 | Chakrabarti et al. | |
| 2011/0254502 A1 | 10/2011 | Yount et al. | |
| 2012/0161715 A1* | 6/2012 | Park | H02J 7/0016 320/136 |
| 2012/0203482 A1 | 8/2012 | Parle et al. | |
| 2013/0043840 A1* | 2/2013 | Bylsma | B60L 11/1866 320/118 |
| 2013/0300371 A1* | 11/2013 | Bills | H02J 7/0016 320/118 |
| 2014/0002021 A1* | 1/2014 | Bertness | B60L 11/1838 320/109 |
| 2014/0266222 A1* | 9/2014 | Baughman | H02J 7/0021 324/426 |
| 2015/0270727 A1* | 9/2015 | Fukute | G01R 31/3658 320/107 |
| 2015/0326043 A1* | 11/2015 | Fink | B60L 11/1803 320/148 |
| 2016/0141894 A1* | 5/2016 | Beaston | H02J 7/0014 320/103 |
| 2017/0072811 A1* | 3/2017 | Tabatowski-Bush | B60L 11/1861 |
| 2017/0194669 A1* | 7/2017 | Christensen | H01M 10/613 |
| 2017/0334306 A1* | 11/2017 | Lupo | B60L 11/1861 |
| 2017/0345101 A1* | 11/2017 | Beaston | G06Q 40/08 |

FOREIGN PATENT DOCUMENTS

| | | |
|---|---|---|
| EP | 2043222 | 4/2009 |
| WO | 2013118738 | 8/2013 |

OTHER PUBLICATIONS

Isermann, "Part IV: Fault-Tolerant Systems" In: "Fault-Diagnosis Systems: An Introduction from Fault Detection to Fault Tolerance", Sep. 15, 2006, Springer, pp. 346-365.
Anonymous: "Atmel Li-Ion, NiMH Battery Measuring, Charge Balancing and Power-supply Circuit ATA6870 Preliminary", Internet Citation, Oct. 30, 2009, pp. 1-56.

* cited by examiner

BATTERY SYSTEM, AND METHOD FOR OPERATING SAID BATTERY SYSTEM

BACKGROUND OF THE INVENTION

The invention relates to a method for operating a battery system having multiple battery cells.

Furthermore, a computer program and a battery management system are disclosed that are configured so as to implement the method. Furthermore, a battery system and a motor vehicle are disclosed, wherein a battery is connected to a drive system of the motor vehicle.

At present, an increasing number of electronic control devices are used in the automotive industry. Examples of these are engine control devices and control devices for the ABS or airbag. A modern day focus of research for electrically driven vehicles is the development of efficient battery packs having associated battery management systems, in other words control devices that are equipped with software for monitoring the battery functionality. Battery management systems ensure inter alia the safe and reliable function of the battery cells and battery packs that are used. Said battery management systems monitor and control currents, voltages, temperatures, insulating resistances and further variables for individual cells and/or the entire battery pack. It is possible with the aid of these variables to achieve management functions that increase the serviceable life, the reliability and the safety of the battery system.

There are various architectures available in order to use measuring technology to ascertain data relating to the battery cells that are typically grouped into modules.

One possibility resides in providing each battery module with a sensor control device that communicates with a main control device by way of example by way of a CAN-Bus (CAN, controller area network) or SPI bus (SPI, serial peripheral interface). These sensor control devices that are hereinunder referred to as measuring chips measure periodically measured values such as voltages of the individual battery cells and temperatures. The measured values are communicated periodically to the main control device.

It is necessary for safety reasons to secure the measured data against interference and loss. One possibility resides in ascertaining the data in a redundant manner and performing a plausibility check with regards to each set of ascertained data.

US 2011/0254502 discloses a fault-tolerant battery management system that is used in electric vehicles. In the described system, the conductor tracks are arranged in different fault areas so that circuits that are allocated to the control, monitoring and the balancing procedures are insulated from circuits that are allocated to real time testing.

WO 2013/118738 discloses an electronic storage module having a multiplicity of batteries, wherein a primary monitoring switching circuit is configured so as to ascertain the operating state of the multiplicity of batteries. A microcontroller unit is connected by way of a primary communications channel to the primary monitoring switching circuit, and a secondary monitoring switching circuit is connected by way of a secondary communications channel to the microcontroller unit. The secondary monitoring switching circuit is configured so as to ascertain the operating state of the multiplicity of batteries if an irregularity in the primary communications channel or an irregularity in the operating state of the primary monitoring switching circuit has been determined.

SUMMARY OF THE INVENTION

In the case of a method in accordance with the invention for operating a battery system having multiple battery cells and a battery management system for monitoring and controlling the battery cells, wherein the battery management system comprises a main control device, a first measuring chain and a second measuring chain in each case having multiple measuring chips that are configured so as to ascertain in a redundant manner measured data at the battery cells and in each case to perform diagnoses at the battery cells and to perform a cell balancing procedure of the battery cells, it is provided that the battery system comprises a control channel by way of which a hierarchy state of the two measuring chains is established, wherein in the event of one of the measuring chains failing, the battery system is transferred into a mode of reduced availability and the hierarchy state in which the other measuring chain ascertains the measured data, performs the diagnoses and performs the cell balancing procedure is set by way of the control channel.

As long as the two measuring chains function free of malfunctions and in a normal manner, in other words as long as none of the measuring chains fail, the safety aims of the battery management system are fulfilled. The battery management system leads to redundant measurements by way of the two measuring chains, wherein the measured data, by way of example cell voltages, currents and temperatures can be checked for plausibility against one another. By way of example, monitoring is performed as to whether the measured data of the two measuring chains are identical within the scope of usual error tolerances. However, if it is identified that a measuring chain in part or completely fails, which by way of example is the case in the case of the data line being severed at an arbitrary point of the chain, then the following measures are preferably performed:

In the case of the second measuring chain failing, it is no longer possible to perform a plausibility check of the data of the two measuring chains. It is assumed that the first measuring chain provides correct data. However, the battery management system is brought into the reduced availability mode. The functions of cell balancing, cell diagnosis etc. furthermore occur in an unchanged manner and are coordinated by way of the first measuring chain.

In the event of the failure of the first measuring chain, it is likewise no longer possible to perform a plausibility check of the measured data of the two measuring chains. As in the case of a failure of the second measuring chain, the battery management system is brought into the reduced availability mode. The second measuring chain assumes the tasks of cell balancing and diagnoses.

The reduced availability mode can be a so-called limp home mode in which the power of the battery system is limited. In addition, it can be provided that in the reduced availability mode it is displayed or otherwise conveyed to the driver that a visit to a repair shop is required.

The type of the possible services, in particular diagnosis services is provided by means of the measuring chip that is used. The measuring chips are preferably configured so as to perform a line break diagnosis and/or a leakage current diagnosis. During the line break diagnosis, the connection between the battery cell and the measuring chip is tested for a line break using the circuits that are built in to the measuring chips. As a consequence, it is possible to diagnose line breaks. In the case of identifying a leakage current, the connection between the battery cell and the measuring chips is investigated for leakage currents using the circuits that are built in to the measuring chips. Circuits of this type are known from the prior art. Further diagnoses are feasible, by way of example a measurement of reference voltages by means of which it is possible to verify the accuracy of the measuring chips.

The measuring chips of a measuring chain and the main control device are connected to one another to a bus system by way of example in a daisy chain in series. It is particularly preferred that the two measuring chains are connected in series by way of in each case a daisy chain to a bus system. The measured data are ascertained and processed by the main control device by way of the bus system that is embodied by way of example as an SPI communications bus.

The cell balancing procedure preferably occurs by means of connecting resistors. Defined battery cells are discharged in a purposeful manner by means of connecting resistors in order to achieve a balanced state of charge of all the battery cells. In the prior art, this method is known as resistive cell balancing.

It is possible to achieve the control channel with any method known from the prior art. The control channel preferably comprises two control lines that are connected to a main control output of the main control device.

Furthermore, a computer program is proposed in accordance with which one of the herein described methods is implemented if the computer program is embodied on a computer device that can be programmed. The computer program can be by way of example a module for starting a battery management system. The computer program can be stored on a machine-readable storage medium, for example on a permanent or re-writable storage medium or in allocation to a computer device, by way of example on a portable storage device such as a CD-ROM, Blu-ray Disc, DVD, a USB stick or a memory card. In addition or alternatively, the computer program can be provided for downloading on a computer device such as for example on a server or a cloud server by way of example by way of a data network such as the internet or a communications connection such as for example a telephone line or a wireless connection.

In accordance with the invention, in addition a battery management system (BMS) is provided for implementing one of the above described methods, wherein the battery management system is used in the case of a battery having multiple battery cells, wherein the battery cells can be interconnected in particular into battery modules. The battery management system comprises a main control device and two measuring chains having in each case multiple measuring chips, wherein the measuring chips are embodied and configured so as to ascertain in a redundant manner measured data at the battery cells and in each case to implement diagnoses and a cell balancing procedure of the battery cells. In addition, the battery management system comprises a control channel by way of which a hierarchy state of the two measuring chains can be established so that in the event of one of the measuring chains failing, the battery system can be transferred into a reduced availability mode and a hierarchy state can be set by way of the control line and in said hierarchy state the other measuring chain ascertains the measured data and performs the diagnoses and the cell balancing procedure.

It is preferred that the battery management system is embodied and/or configured so as to perform the method described herein. Accordingly, the features that are described within the scope of the method accordingly apply to the battery management system and conversely the features that are described within the scope of the battery management system accordingly apply for the method.

The units of the battery management system are to be understood as functional units that are not necessarily physically separated from one another. Multiple units of the battery management system can thus be achieved in one single physical unit, for example if multiple functions are implemented on a control device. The units of the battery management system can also be implemented in hardware components, by way of example by means of sensor units, storage units, application specific integrated switching circuits (ASIC, application specific circuit) or microcontrollers.

In accordance with the invention, in addition a battery system having a battery that comprises multiple battery cells, and a battery management system of this type is provided. The battery can in particular be a lithium ion battery or a nickel metal hydride battery and can be connected to a drive system of a motor vehicle.

The terms "battery" and "battery unit" are used in the present description to describe the usual term for rechargeable battery and rechargeable battery unit. The battery comprises one or multiple battery units that can be referred to as a battery cell, a battery module, a module string or a battery pack. The battery cells are preferably spatially combined into modules in the battery and connected to one another using switching technology, by way of example in series or in parallel. Multiple modules can form so-called battery direct converters (BDC) and multiple battery direct converters can form a battery direct inverter (BDI).

In addition, in accordance with the invention, a motor vehicle having a battery system of this type is provided, wherein the battery of the battery system is connected to a drive system of the motor vehicle. The motor vehicle can be embodied as a solely electric vehicle and can comprise exclusively an electric drive system. Alternatively, the motor vehicle can be embodied as a hybrid vehicle that comprises an electric drive system and an internal combustion engine. In some variants, it can be provided that the battery of the hybrid vehicle can be charged internally by way of a generator with excess energy from the internal combustion engine. Hybrid vehicles that can be charged externally (PHEV, plug-in hybrid electric vehicle) additionally provide the possibility of charging the battery by way of the external current network. In the case of motor vehicles that are embodied in this manner, the driving cycle comprises a driving operation and/or a charging operation as an operating phase in which operating parameters are ascertained.

The proposed method describes a redundant design of measuring chains for increasing the safety in a battery system.

Advantageously, the method can be achieved by means of few complex and cost-effective measuring chips, so called sensor front ends so that only few additional costs occur.

In addition, a method is proposed in which the robustness of the battery management system is increased since in the case of a failure of one of the measuring chains, the remaining measuring chain is assigned the management functions. A limited operation of the battery can thus be permitted in the event of one of the measuring chains failing so that a failed measuring chain does not lead to a failure of measurements and to the vehicle being left unusable.

DETAILED DESCRIPTION

Figure 1:
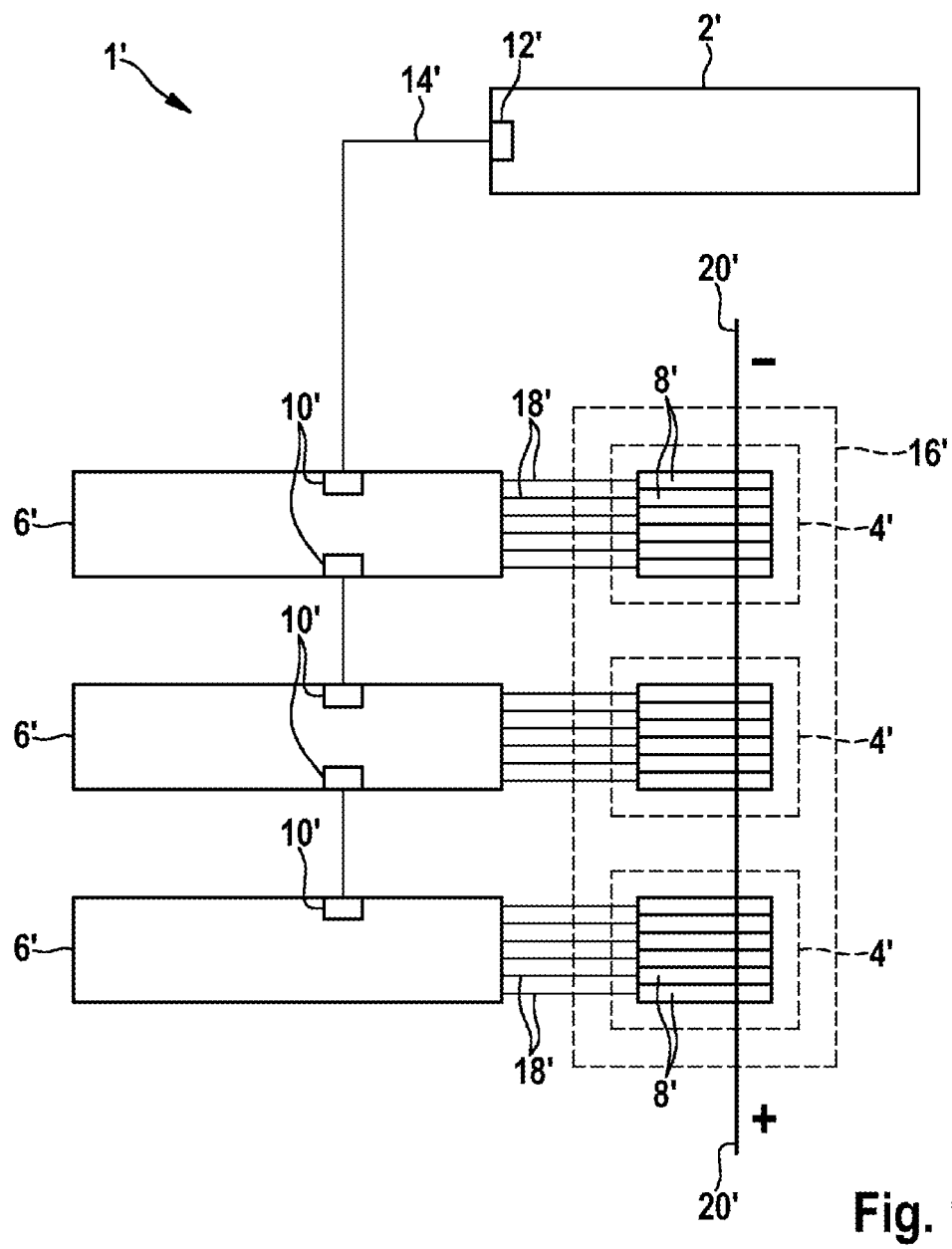
FIG. 1 illustrates schematically a battery system in accordance with the prior art.

The battery system 1' in FIG. 1 comprises a main control device 2' that can also be referred to as a BCU (Battery control unit) and a battery 16' having a number of battery modules 4' that comprise in each case dedicated measuring chips 6'. The main control device 2' implements functions for controlling and monitoring the battery 16'.

In this case, by way of example, six battery cells 8' are allocated to each battery module 4', wherein said battery cells can be connected in series and in part additionally in parallel in order to achieve required performance and energy data with the battery 16'. The battery 16' provides the electrical energy at battery terminals 20' by way of example for driving a vehicle.

The communication between the main control device 2' and the measuring chips 6' occurs by way of a communications channel 14' and suitable interfaces 10', 12'.

The measuring chips 6' typically control cell monitoring units or module monitoring units (both not illustrated) that continuously ascertain with defined scanning rates, operating parameters such as voltages, current strengths or temperatures of individual battery cells 8' or individual battery modules 4' as measured values and provide the ascertained measured values to the measuring chips 6'. The measuring chips 6' are connected by way of measuring lines 18' to the battery cells 8'.

Figure 2:
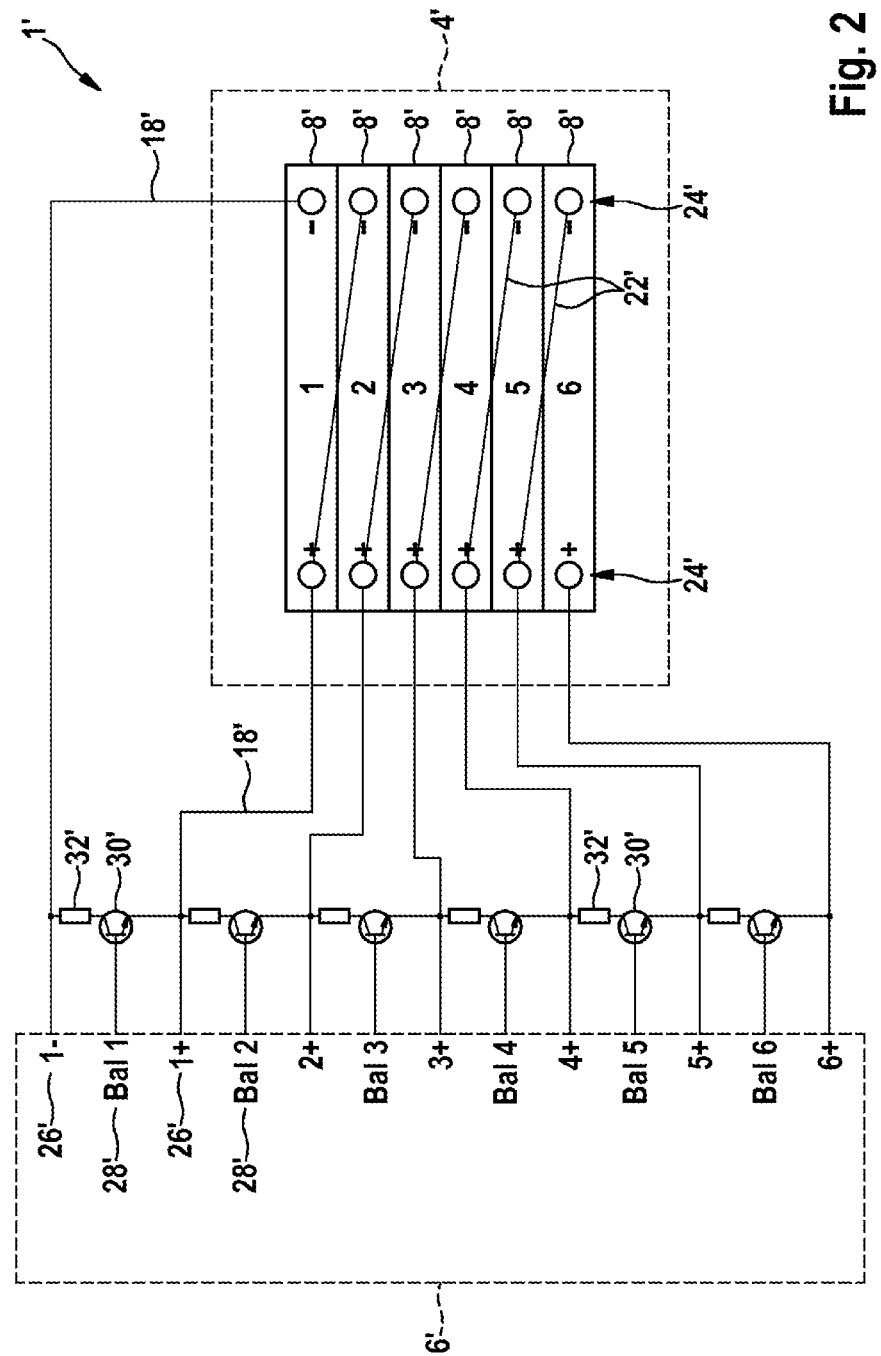
FIG. 2 illustrates schematically a cell balancing system in accordance with the prior art.

FIG. 2 illustrates a detailed view of the battery system 1' in accordance with the prior art, wherein a battery module 4' and an associated measuring chip 6' are illustrated. The battery module 4' comprises six battery cells 8' whose cell terminals 24' are connected to one another in series by way of cell connectors 22'. The six battery cells 8' are numbered consecutively.

The measuring chip 6' taps measured values by way of measuring inputs 26', the measuring lines 18' lead to said measuring inputs and said measured values are by way of example the voltages at the individual battery cells 8'. The measuring chip 6' furthermore comprises control outputs 28' by way of which switching elements 30' are controlled, and said control outputs can connect resistors 32', said resistors also being referred to as balancing resistors, in relation to individual battery cells 8' so that a cell balancing procedure can be achieved.

FIG. 2 illustrates this in a greatly simplified manner, this technology is however known to the person skilled in the art from the prior art. Other functions such as identifying a line break are likewise controlled by way of the control outputs 28' of the measuring chips 6', wherein this is likewise already known.

Exemplary embodiments of the invention are illustrated in the following drawings and are further explained in the description hereinunder.

Figure 3:
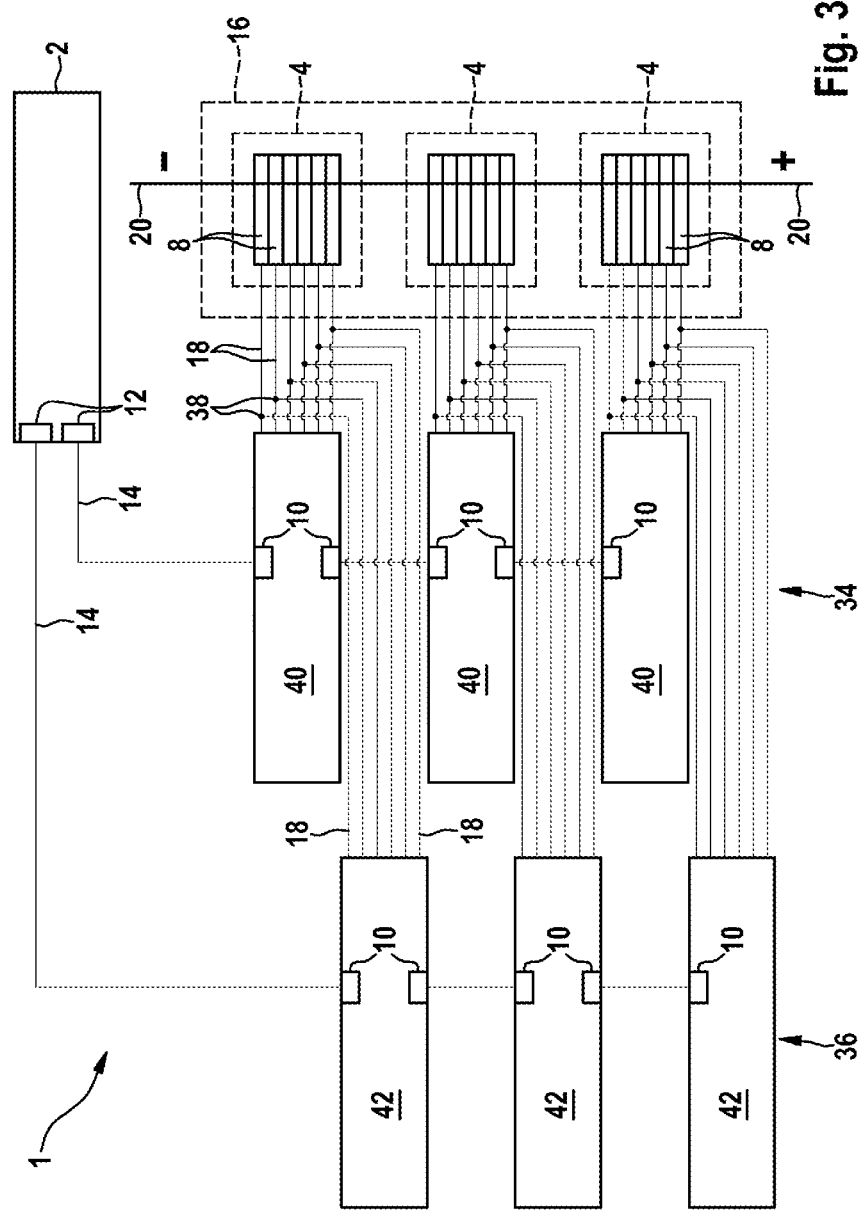
FIG. 3 illustrates schematically a battery system in accordance with an exemplary embodiment of the invention and FIG. 4 illustrates schematically a cell balancing system in accordance with an embodiment of the invention.

FIG. 3 illustrates a battery system 1 in accordance with the invention having a main control device 2 and multiple battery cells 8 that are interconnected into three battery modules 4 in order to provide the required energy at the battery terminals 20. The individual battery cells 8 are by way of example lithium ion cells having a voltage range of 2.8 to 4.2 volts. The battery system 1 comprises a battery management system in addition to a battery 16 having the battery modules 4 and the battery cells 8, said battery management system comprising the main control device 2, a first measuring chain 34 having measuring chips 40 of a first type and a second measuring chain 36 having measuring chips 42 of a second type.

The measuring chips 40, 42 of the first and second type that can also be referred to as CSC (cell supervision circuits) are by way of example constructed in an identical or different manner. The measuring chips 40, 42 of the first and second type are connected to the individual battery cells 8 by way of measuring lines 18, wherein the measuring lines 18 branch out at branching sites 38 starting from each battery cell 8 so that each signal is supplied on one side to a measuring chip of the first type 40 and on the other side to a measuring chip of the second type 42.

The measuring chips 40, 42 of the first and second type are connected to one another by way of suitable interfaces 10, 12 and communications channels 14 and in addition in each case are connected directly or indirectly to the main control device 2, wherein the communications channels 14 by way of example can be embodied as an SPI bus or as a CAN bus. The communications channels 14 can be identical or different.

Figure 4:
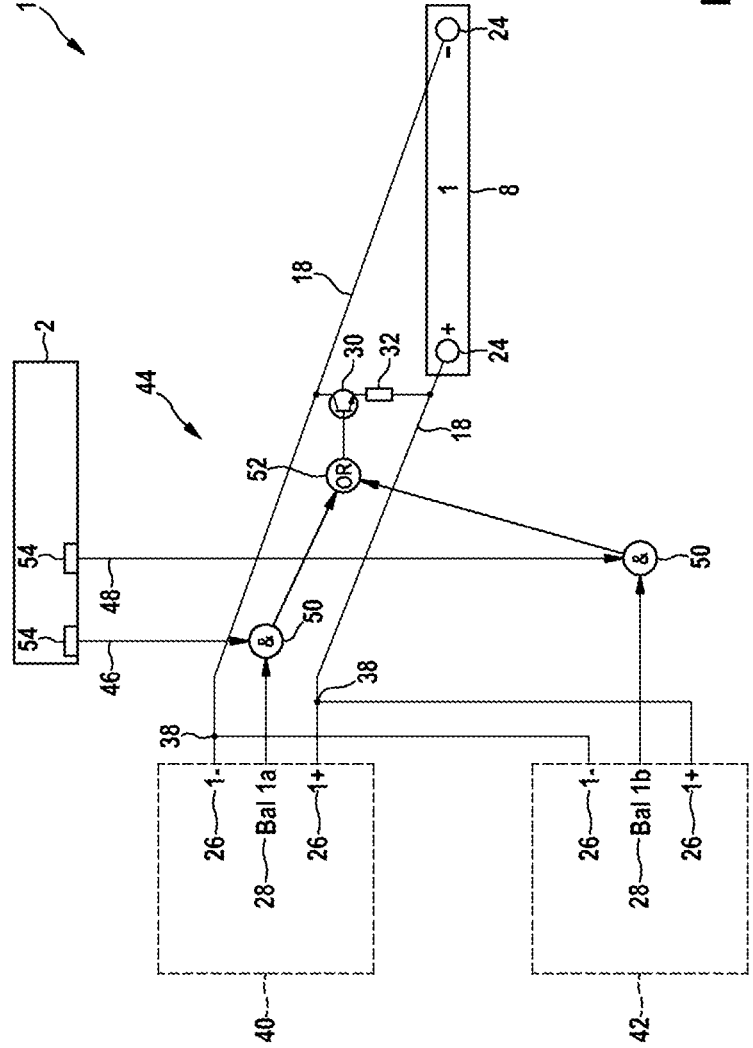

Operating parameters, in particular voltages, currents and temperatures of the battery cells 8 or battery modules 4 are ascertained in a redundant manner by way of the measuring chains 34, 36 and in addition a diagnosis and a cell balancing procedure occur as is further described hereinunder with reference to FIG. 4. As a consequence, the system tasks of the battery management system in the case of a measuring chain 34, 36 failing can be performed in an unchanged manner, which renders the battery system 1 safer and more robust.

FIG. 4 illustrates in detail the battery system 1 in accordance with the invention having a battery cell 8 (showing an exemplary number 1), wherein the cell voltage of said battery cell is supplied by way of cell terminals 24, measuring lines 18, branching sites 38 and measuring inputs 26 to a measuring chip 40 of the first type and to a measuring chip 42 of the second type. The measuring chips 40, 42 of the first and the second type comprise control outputs 28 by way of which in each case a switching element 30 can be controlled in order to connect a resistor 32 that expediently discharges the battery cell 8. The control channel 44 is provided in lieu of an entirely duplicate connection of the first and second measuring chain 34, 36 for ascertaining the measured values in a redundant manner, for providing the cell balancing procedure and the cell diagnosis even in the event of a failure of one of the measuring chains 34, 36, said control channel being embodied by means of a first control line 46 and a second control line 48 and a hierarchy state of the two measuring chains 40, 42 can be established by way of said control channel. It is possible by way of the control channel 44 to set that in each case the other measuring chain 40, 42 ascertains the measured data, performs the diagnosis and performs the cell balancing procedure if one of the measuring chains 40, 42 has failed.

For this purpose, state connectors 50, 52 are provided in the control lines 46, 48. A first state connector 50 is provided as an AND-connection for each measuring chain 40, 42. The first state connectors 50 connect the control outputs 28 of the measuring chips 40, 42 to a main control output 54 of the main control device 2. In addition, a second state connector 52 is provided as an OR-connection. The second state connector 52 connects the outputs of the first state connector 50 to the switching element 30.

In the normal case, the main control device 2 sets the signal "first measuring chain 34 active" to "1" and sets the signal "second measuring chain 36 active" to "0". As a consequence, the signals of the first measuring chain 34 are assumed since the first state connector 50 combines the "1" of the main control device 2 with the signal of the control output 28 of the measuring chips 40 of the first type. The signals of the second measuring chain 36 are ignored since the first state connector 50 connects the "0" of the main control device 2 to the signal of the control output 28 of the measuring chip 42 of the second type to one another.

It is possible by way of the second state connector 52, the OR-connection, for the cell balancing procedure to be performed both by the first measuring chain 34 as well as by the second measuring chain 36.

If the first measuring chain 34 should fail or function in an impaired manner, the main control device 2 sets the signal "first measuring chain 34 active" to "0" and sets the signal "second measuring chain 36 active" to 1. All the signals of the first measuring chain 34 are accordingly ignored, in particular also erroneously generated signals of the defective first measuring chain 34.

The invention is not limited to the described exemplary embodiments and the emphasized aspects. On the contrary, within the scope that is disclosed by means of the claims, a multiplicity of deviations is possible that lie within the scope of the person skilled in the art.

The invention claimed is:

1. A method for operating a battery system (1) having multiple battery cells (8) and a battery management system for monitoring and controlling the battery cells (8), wherein the battery management system comprises a main control device (2), a first measuring chain (34) having a first plurality of measuring chips (40, 42), and a second measuring chain (36) having a second plurality of measuring chips (40, 42), wherein the first and second plurality of measuring chips (40, 42) are configured to ascertain, in a redundant manner, measured data at the battery cells (8) and in each case to perform diagnoses at the battery cells (8), and a cell balancing procedure of the battery cells (8), the method comprising:
   establishing a hierarchy state of the first and second measuring chains (34, 36) by a control channel (44) of the battery system (1);
   wherein in the event of the failure of one of the measuring chains (34, 36) the battery system (1) transfers into a reduced availability mode and the control channel (44) establishes the hierarchy state such that the other measuring chain (34, 36) ascertains the measured data, performs the diagnoses and performs the cell balancing procedure.

2. The method as claimed in claim 1, characterized in that a plausibility check of the ascertained measured data is performed with regards to each set of data in the event of normal function of the measuring chains (34, 36).

3. The method as claimed in claim 1, characterized in that the diagnoses comprise diagnosing a line break and/or a leakage current.

4. The method as claimed in claim 1, characterized in that the measuring chips (40, 42) are connected to the main control device (2) in a daisy chain.

5. The method as claimed in claim 1, characterized in that the cell balancing procedure occurs by means of connecting resistors (32).

6. The method as claimed in claim 1, characterized in that the control channel (44) comprises two control lines (46, 48) that are connected to a main control output (54) of the main control device (2).

7. A non-transitory computer readable medium including a computer program for execution on a main control device; the computer program operating a battery system (1) having multiple battery cells (8) and a battery management system for monitoring and controlling the battery cells (8), wherein the battery management system comprises the main control device (2), a first measuring chain (34) having a first plurality of measuring chips (40, 42), and a second measuring chain (36) having a second plurality of measuring chips (40, 42), wherein the first and second plurality of measuring chips (40, 42) are configured to ascertain, in a redundant manner, measured data at the battery cells (8) and in each case to perform diagnoses at the battery cells (8), and a cell balancing procedure of the battery cells (8), the computer program establishing a hierarchy state of the first and second measuring chains (34, 36) by a control channel (44) of the battery system (1); wherein in the event of the failure of one of the measuring chains (34, 36) the battery system (1) transfers into a reduced availability mode and the control channel (44) establishes the hierarchy state such that the other measuring chain (34, 36) ascertains the measured data, performs the diagnoses and performs the cell balancing procedure.

8. A battery management system of a battery (16) having multiple battery cells (8), the battery management system comprising:
   a main control device (2) and
   two measuring chains (34, 36),
   wherein the measuring chains (34, 36) in each case comprise multiple measuring chips (40, 42) that are embodied and configured so as to ascertain, in a redundant manner, measured data at the battery cells and in each case to perform diagnoses and a cell balancing procedure of the battery cells (8), and are connected to a control channel (44) and a hierarchy state of the two measuring chains (34, 36) is set by the control channel;
   wherein in the event of the failure of one of the measuring chains (34, 36) the battery system (1) transfers into a reduced availability mode and the control channel (44) establishes the hierarchy state such that the other measuring chain (34, 36) ascertains the measured data, performs the diagnoses and performs the cell balancing procedure.

9. The battery system (1) having a battery (16) and a battery management system as claimed in claim 8, wherein the battery (16) is connected to a drive system of a motor vehicle.

* * * * *